United States Patent
Tang et al.

(10) Patent No.: US 12,431,357 B2
(45) Date of Patent: Sep. 30, 2025

(54) METHOD FOR MANUFACTURING HIGH-VOLTAGE METAL GATE DEVICE

(71) Applicant: Shanghai Huali Integrated Circuit Corporation, Shanghai (CN)

(72) Inventors: Xiaoliang Tang, Shanghai (CN); Haoyu Chen, Shanghai (CN); Hua Shao, Shanghai (CN)

(73) Assignee: Shanghai Huali Integrated Circuit Corporation, Shanghai (CN)

( * ) Notice: Subject to any disclaimer, the term of this patent is extended or adjusted under 35 U.S.C. 154(b) by 635 days.

(21) Appl. No.: 17/958,583

(22) Filed: Oct. 3, 2022

(65) Prior Publication Data

US 2023/0142968 A1    May 11, 2023

(30) Foreign Application Priority Data

Nov. 9, 2021   (CN) .......................... 202111320661.9

(51) Int. Cl.
*H01L 21/28* (2006.01)
*H10D 64/01* (2025.01)
*H10D 64/66* (2025.01)

(52) U.S. Cl.
CPC .. *H01L 21/28123* (2013.01); *H01L 21/28079* (2013.01); *H10D 64/017* (2025.01); *H10D 64/665* (2025.01)

(58) Field of Classification Search
None
See application file for complete search history.

(56) References Cited

U.S. PATENT DOCUMENTS

2017/0186650 A1*   6/2017   Shen ................... H01L 21/3212

\* cited by examiner

*Primary Examiner* — Joseph C. Nicely
*Assistant Examiner* — Lamont B Koo
(74) *Attorney, Agent, or Firm* — Banner & Witcoff, Ltd.

(57) ABSTRACT

The present application discloses a method for manufacturing a high-voltage metal gate device. After the deposition of a gate metal through a normal process, in CMP processes performed to the gate metal, firstly a first CMP process is performed to thin the gate metal to a certain thickness in advance, then a blocking dielectric layer is deposited, a large-area high-voltage gate region is opened through photolithography, and the blocking dielectric layer other than the blocking dielectric layer in the large-area high-voltage gate region is removed through etching. In a second CMP process performed to the gate metal, due to the blocking dielectric layer on the surface of the large-area gate metal in the high-voltage gate region, the polishing speed is slow, and CMP dishing will not be caused.

10 Claims, 5 Drawing Sheets

METHOD FOR MANUFACTURING HIGH-VOLTAGE METAL GATE DEVICE

CROSS-REFERENCE TO RELATED APPLICATIONS

This application claims the priority to Chinese Patent Application No. 202111320661.9, filed on Nov. 9, 2021, the disclosure of which is incorporated herein by reference in its entirety.

TECHNICAL FIELD

The present application relates to a semiconductor manufacturing technology, in particular to a method for manufacturing a high-voltage metal gate device.

BACKGROUND

From the node of 28 nm, the high-performance process will use HK (high dielectric constant) dielectric and metal gate to improve the performance of the device. Metal Chemical-Mechanical Polishing (CMP) process is inevitably used in the metal gate process. In the metal CMP process, large patterns will inevitably have the problem of dishing, so the size of the gate cannot be designed too large. However, for the high-voltage device (with operating voltage of 8V-40V), it is inevitable to need a relatively large gate size to undertake high-voltage operation, which will cause the decline or even loss of gate height in large metal gates. The process specifically includes the following steps:
1. After a pre-process, gate photolithography, etching and sidewall processes are performed to define at least one dummy poly gate, and at least one dummy poly gate is dummy poly high-voltage gate 2, and dummy polycrystalline 3 of the dummy poly gate is formed on a gate dielectric layer 8, as illustrated in FIG. 1.
2. Isolation dielectric 4 is filled between the dummy poly gates and a CMP process is performed, as illustrated in FIG. 2.
3. The dummy polycrystalline on the gate dielectric layer 8 of the dummy poly gate is removed through selective etching, as illustrated in FIG. 3.
4. A gate metal 5 is deposited on a wafer, as illustrated in FIG. 4.
5. Gate metal CMP is performed. Since the gate metal 5 on the high-voltage gate 2 is comparatively large, CMP dishing will be caused, resulting in that the middle of the gate metal 5 on the high-voltage gate 2 is thin or even empty, as illustrated in FIG. 5.

In order to solve this problem, the current common method is to add a trench in a large-area high-voltage gate. The specific process includes the following steps:
(1) During the lithography and etching of the dummy poly gate, a trench connected to the gate dielectric layer 8 is dug out through a mask in the middle of the large-area dummy polycrystalline 3 on the high-voltage gate 2, as illustrated in FIG. 6.
(2) An isolation dielectric 4 is filled between the dummy poly gates and a CMP process is performed.
(3) The dummy polycrystalline 3 on the high-voltage gate 2 is removed through selective etching.
(4) A gate metal 5 is deposited on a wafer.
(5) A gate metal CMP process is performed.

In the method of adding a trench in the dummy polycrystalline 3 of the large-area high-voltage gate 2, since the middle of the large-area dummy polycrystalline 3 of the high-voltage gate 2 is blocked by the isolation dielectric 4 filled in the trench, CMP dishing will not be caused. However, in the method of adding a trench in the large-area dummy polycrystalline 3 of the high-voltage gate 2, as illustrated in FIG. 6, since the trench in the large-area dummy polycrystalline 3 of the high-voltage gate 2 exposes the gate dielectric layer 8 below, subsequent processes including ion implantation, metal silicide and the like will introduce ions into the gate dielectric layer 8. At the same time, etching and acid pickling will also influence the exposed gate dielectric layer 8, and the electrical properties of the high-voltage device will be affected, causing the electrical properties of the high-voltage device to shift under high voltage and high temperature, and reducing the reliability of the high-voltage device.

BRIEF SUMMARY

The technical problem to be solved by the present application is to provide a method for manufacturing a high-voltage metal gate device, which not only avoids the dishing problem of the large gate metal, but also can avoid affecting the electrical properties of the high-voltage device due to the influence on the gate dielectric layer.

In order to solve the above technical problem, the method for manufacturing the high-voltage metal gate device provided by the present application includes the following steps:
S1: after a pre-process, performing gate photolithography, etching and sidewall processes to define at least one dummy poly gate, and at least one dummy poly gate is dummy poly high-voltage gate 2, and dummy polycrystalline 3 of the dummy poly gate being formed on a gate dielectric layer 8.
S2: filling isolation dielectric 4 between the dummy poly gates and performing a CMP process;
S3: removing the dummy polycrystalline on the gate dielectric layer 8 of the dummy poly gate through selective etching;
S4: depositing a gate metal 5 on a wafer;
S5: performing a gate metal CMP process to reduce the thickness of the gate metal 5 deposited on the wafer;
S6: depositing a blocking dielectric layer 6 on the gate metal 5;
S7: opening a high-voltage gate 2 region through photolithography, and removing the blocking dielectric layer 6 outside the high-voltage gate 2 region through etching;
S8: performing a gate metal CMP process to reduce the thickness of the gate metal 5 deposited on the wafer, wherein due to the blocking effect of the blocking dielectric layer 6, the gate metal 5 in the high-voltage gate 2 region is higher than the gate metal 5 outside the high-voltage gate 2 region;
S9: removing the blocking dielectric layer 6 on the gate metal 5 in the high-voltage gate 2 region through dry etching or acid pickling.

Further, after step S9, the method for manufacturing the high-voltage metal gate device further includes step S10: performing a gate metal CMP process to adjust the height of the gate metal 5.

Further, in step S8, the gate metal CMP process is performed to remove the gate metal 5 above the isolation dielectric 4 outside the high-voltage gate 2 region, wherein due to the blocking effect of the blocking dielectric layer 6, the gate metal 5 in the high-voltage gate 2 region is higher than the blocking dielectric layer 6.

Further, in step S1, the defined dummy poly gate includes at least one dummy polycrystalline high-voltage gate 2 and one dummy polycrystalline low-voltage gate 1.

Further, the length of the high-voltage gate 2 is greater than 2.5 μm.

Further, in step S4, the thickness of the gate metal 5 deposited on the wafer is greater than the thickness of the isolation dielectric 4 between gates after step S2.

Further, in step S4, the thickness of the gate metal 5 deposited on the wafer is 30 nm-200 nm.

Further, in step S5, the gate metal CMP process is performed to reduce the thickness of the gate metal 5 deposited on the wafer, and the lowest position of an upper surface of the gate metal 5 is higher than the isolation dielectric 4 between gates.

Further, in S5, the gate metal CMP process is performed to reduce the thickness of the gate metal 5 deposited on the wafer by 1/3-2/3.

Further, the gate dielectric layer 8 is SiON, $HfO_2$ or $SiO_2$, the isolation dielectric 4 is SiN or $SiO_2$, the blocking dielectric layer 6 is SiN or $SiO_2$, the gate metal 5 is Al, Ti or W.

In the method for manufacturing the high-voltage metal gate device provided by the present application, after the deposition of a gate metal 5 through a normal process, in CMP processes performed to the gate metal 5, firstly a first CMP process is performed to thin the gate metal 5 to a certain thickness in advance, then a blocking dielectric layer 6 is deposited, a large-area high-voltage gate 2 region is opened through photolithography, and the blocking dielectric layer 6 other than the blocking dielectric layer in the large-area high-voltage gate 2 region is removed through etching. In a second CMP process performed to the gate metal 5, due to the blocking dielectric layer on the surface of the large-area gate metal 5 in the high-voltage gate 2 region, the polishing speed is slow, and CMP dishing will not be caused. The method for manufacturing the high-voltage metal gate device not only avoids the dishing problem of the large gate metal, but also can avoid affecting the electrical properties of the high-voltage device due to the influence on the gate dielectric layer 8.

BRIEF DESCRIPTION OF THE DRAWINGS

In order to more clearly describe the technical solution of the present application, the following will briefly introduce the drawings needed in the present application. It is obvious that the drawings in the following description are only some embodiments of the present application. For those skilled in the art, other drawings can be obtained based on these drawings without contributing any inventive labor.

DETAILED DESCRIPTION

The technical solution of the present application will be clearly and completely described below with reference to the drawings. Obviously, the described embodiments are part of the embodiments of the present application, instead of all of them. Based on the embodiments in the present application, all other embodiments obtained by those skilled in the art without contributing any inventive labor still fall within the scope of protection of the present application.

Embodiment 1

Figure 1:
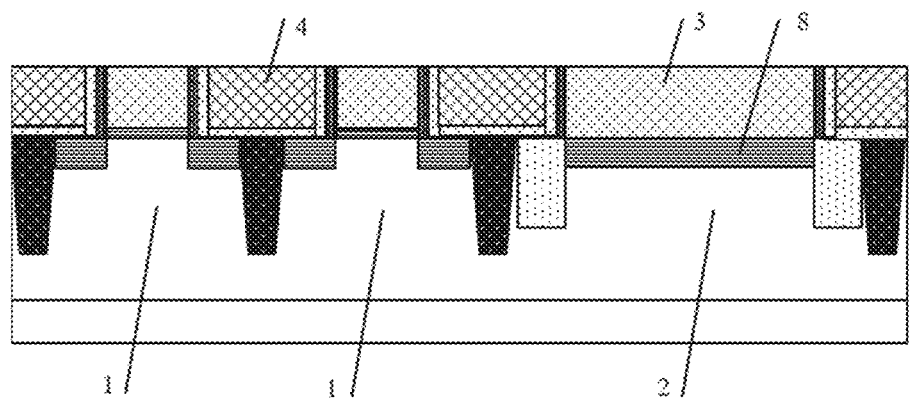
FIG. 1 illustrates a schematic diagram of a dummy poly gate defined by adopting a method for manufacturing a high-voltage metal gate device.

A method for manufacturing a high-voltage metal gate device includes the following steps:

S1: after a pre-process, performing gate photolithography, etching and sidewall processes to define at least one dummy poly gate, and at least one dummy poly gate is dummy poly high-voltage gate 2, and dummy polycrystalline 3 of the dummy poly gate being formed on a gate dielectric layer 8, as illustrated in FIG. 1.

Figure 2:
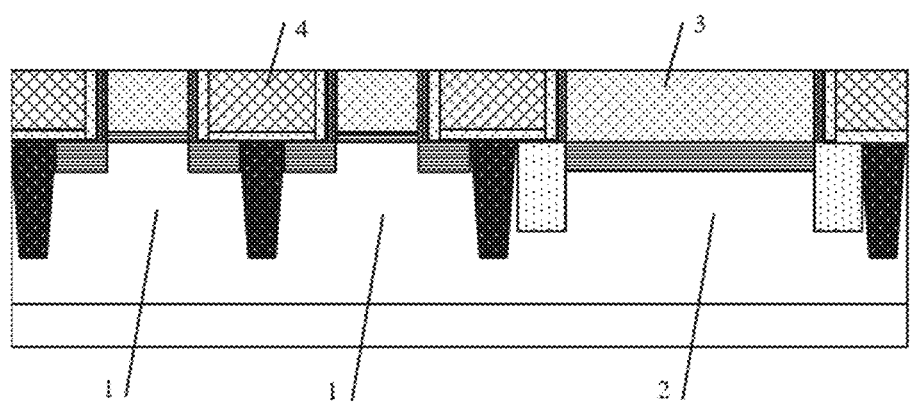
FIG. 2 illustrates a schematic diagram after filling an isolation dielectric between dummy poly gates in a method for manufacturing a high-voltage metal gate device.
Figure 3:
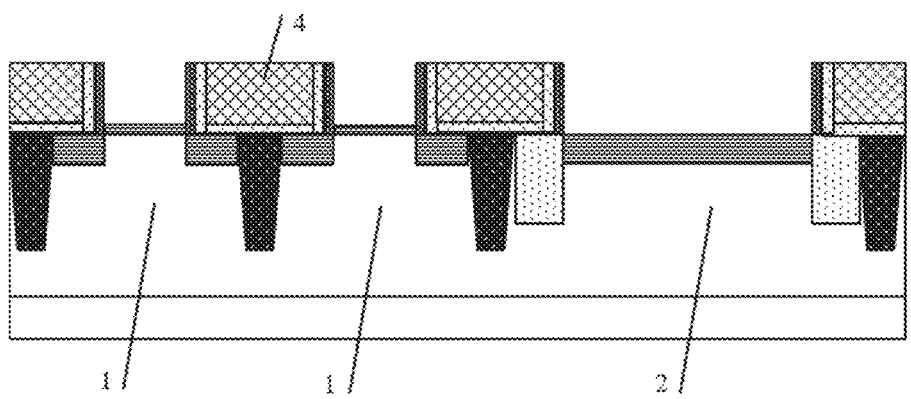
FIG. 3 illustrates a schematic diagram after removing dummy polycrystalline in a method for manufacturing a high-voltage metal gate device.
Figure 4:
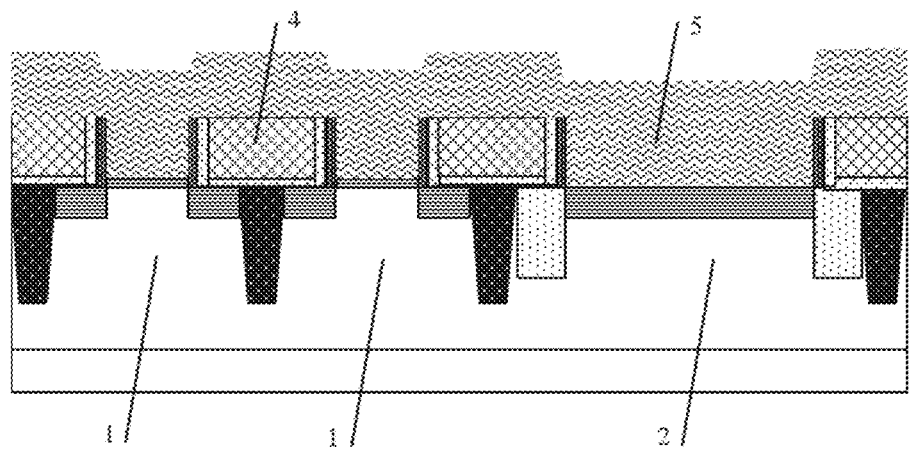
FIG. 4 illustrates a schematic diagram after depositing a gate metal in a method for manufacturing a high-voltage metal gate device.
Figure 5:
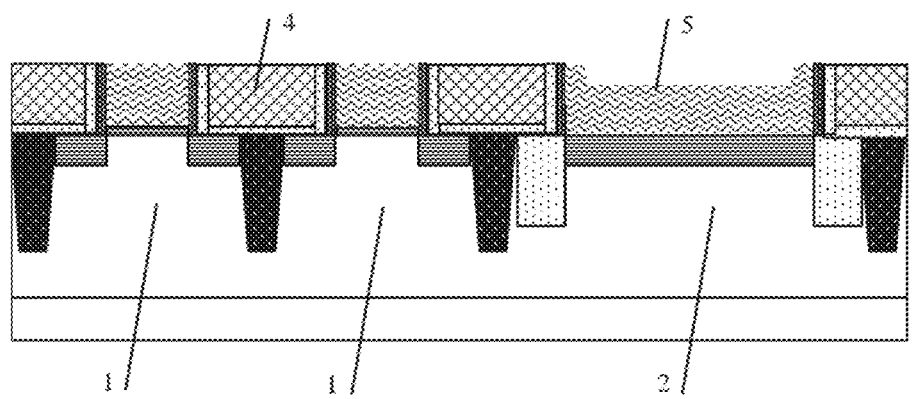
FIG. 5 illustrates a schematic diagram of CMP dishing caused during gate metal CMP in an existing method for manufacturing a high-voltage metal gate device.
Figure 6:
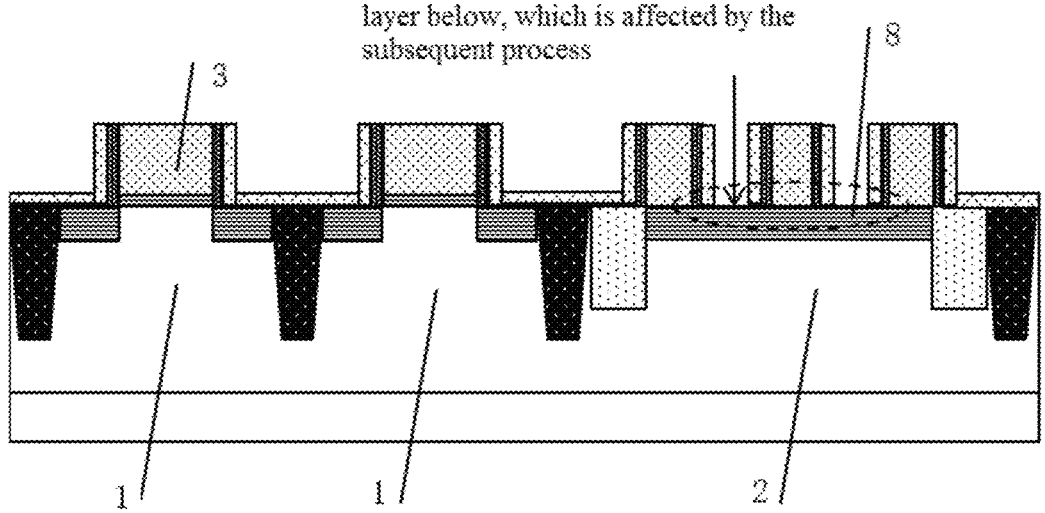
FIG. 6 illustrates a schematic diagram of a trench connected to a gate dielectric layer dug out through a mask in the middle of large-area dummy polycrystalline on a high-voltage gate.
Figure 7:
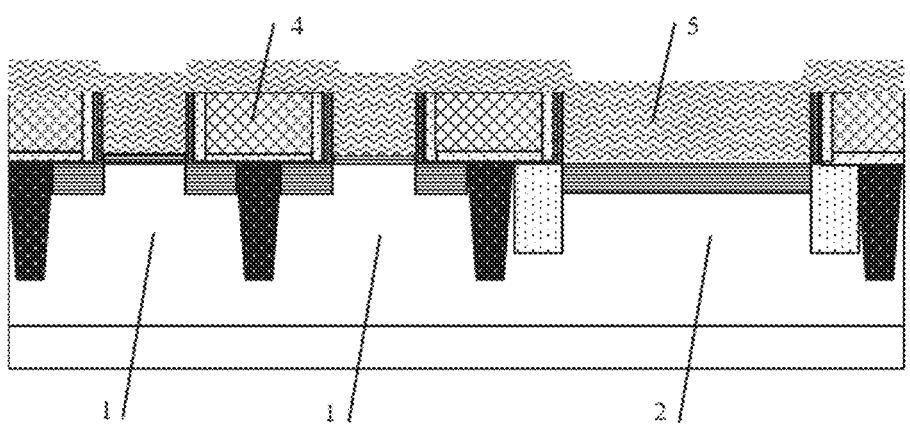
FIG. 7 illustrates a schematic diagram after performing a gate metal CMP process to reduce the thickness of a gate metal for the first time in a method for manufacturing a high-voltage metal gate device according to an embodiment of the present application.
Figure 8:
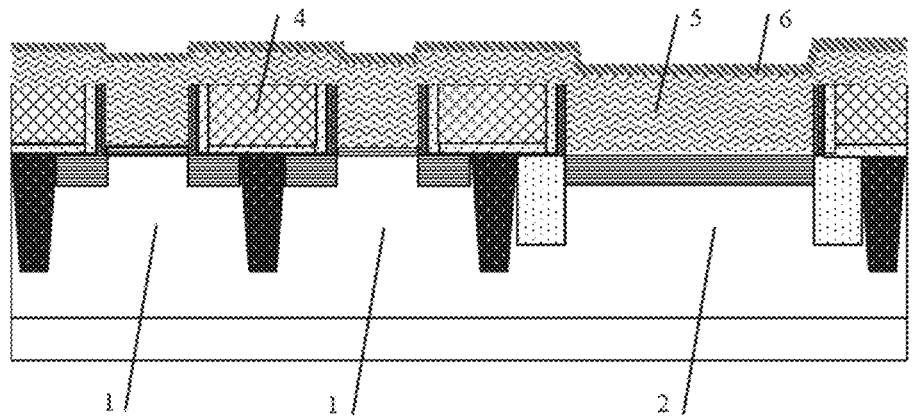
FIG. 8 illustrates a schematic diagram after depositing a blocking dielectric layer on a gate metal in a method for manufacturing a high-voltage metal gate device according to an embodiment of the present application.
Figure 9:
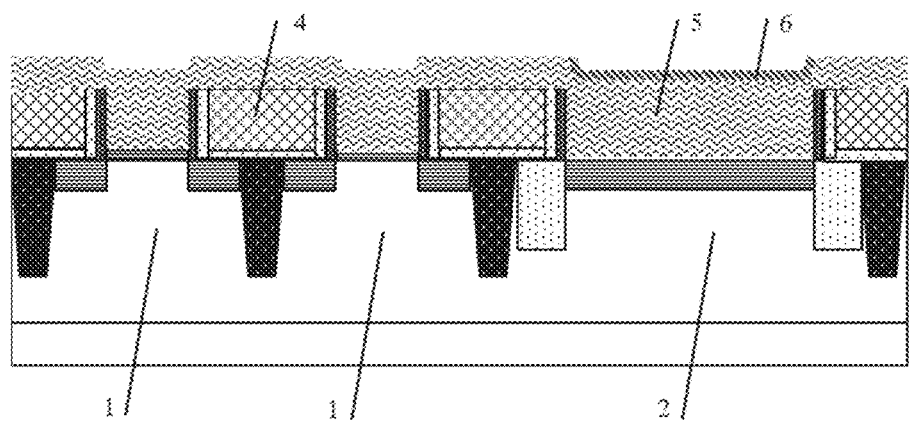
FIG. 9 illustrates a schematic diagram after removing a blocking dielectric layer outside a high-voltage gate region in a method for manufacturing a high-voltage metal gate device according to an embodiment of the present application.
Figure 10:
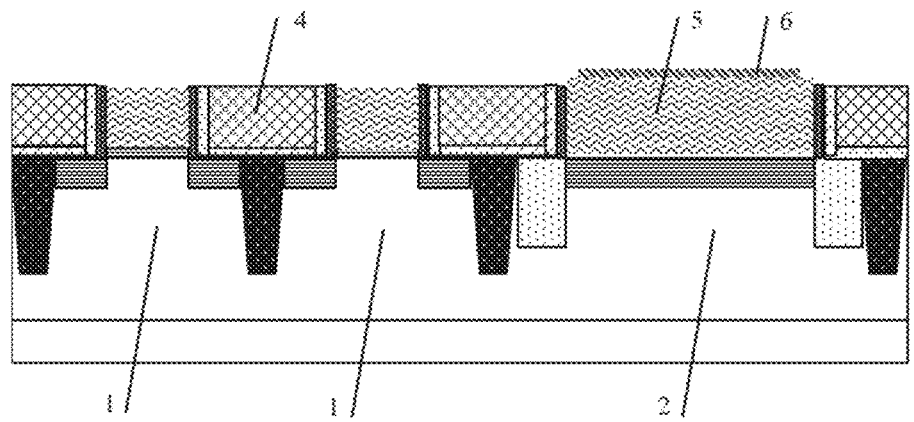
FIG. 10 illustrates a schematic diagram after performing a gate metal CMP process to reduce the thickness of a gate metal for the second time in a method for manufacturing a high-voltage metal gate device according to an embodiment of the present application.

S2: filling isolation dielectric 4 between the dummy poly gates and performing a CMP process, as illustrated in FIG. 2;

S3: removing the dummy polycrystalline on the gate dielectric layer 8 of the dummy poly gate through selective etching, as illustrated in FIG. 3;

S4: depositing a gate metal 5 on a wafer, as illustrated in FIG. 4;

S5: performing a gate metal CMP process to reduce the thickness of the gate metal 5 deposited on the wafer, as illustrated in FIG. 7;

S6: depositing a blocking dielectric layer 6 on the gate metal 5, as illustrated in FIG. 8;

S7: opening a high-voltage gate 2 region through photolithography, and removing the blocking dielectric layer 6 outside the high-voltage gate 2 region through etching, as illustrated in FIG. 9;

S8: performing a gate metal CMP process to reduce the thickness of the gate metal 5 deposited on the wafer, wherein due to the blocking effect of the blocking dielectric layer 6, the gate metal 5 in the high-voltage gate 2 region is higher than the gate metal 5 outside the high-voltage gate 2 region, as illustrated in FIG. 10;

S9: removing the blocking dielectric layer 6 on the gate metal 5 in the high-voltage gate 2 region through dry etching or acid pickling.

Figure 11:
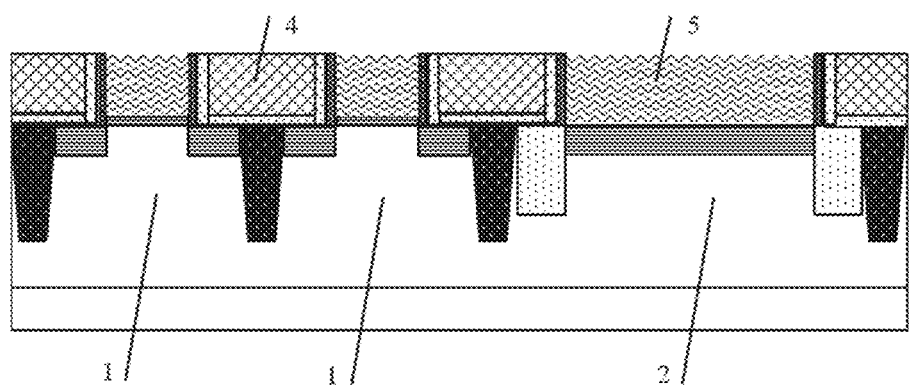
FIG. 11 illustrates a schematic diagram after removing a blocking dielectric layer on a gate metal in a high-voltage gate region and performing slight polishing in a method for manufacturing a high-voltage metal gate device according to an embodiment of the present application.

Further, after step S9, the method for manufacturing the high-voltage metal gate device further includes step S10: performing a slight gate metal CMP process to adjust the height of the gate metal 5, as illustrated in FIG. 11.

In the method for manufacturing the high-voltage metal gate device according to embodiment 1, after the deposition of a gate metal 5 through a normal process, in CMP processes performed to the gate metal 5, firstly a first CMP process is performed to thin the gate metal 5 to a certain thickness in advance, then a blocking dielectric layer 6 is deposited, a large-area high-voltage gate 2 region is opened through photolithography, and the blocking dielectric layer 6 other than the blocking dielectric layer in the large-area high-voltage gate 2 region is removed through etching. In a second CMP process performed to the gate metal 5, due to the blocking dielectric layer 6 on the surface of the large-area gate metal 5 in the high-voltage gate 2 region, the polishing speed is slow, and CMP dishing will not be caused.

The method for manufacturing the high-voltage metal gate device according to embodiment 1 not only avoids the dishing problem of the large gate metal, but also can avoid affecting the electrical properties of the high-voltage device due to the influence on the gate dielectric layer 8.

Embodiment 2

Based on the method for manufacturing the high-voltage metal gate device according to embodiment 1, in step S1, the defined dummy poly gate includes at least one dummy polycrystalline high-voltage gate 2 and one dummy polycrystalline low-voltage gate 1.

Further, the length of the high-voltage gate 2 is greater than 2.5 μm.

Embodiment 3

Based on the method for manufacturing the high-voltage metal gate device according to embodiment 1, in step S8, the gate metal CMP process is performed to remove the gate metal 5 above the isolation dielectric 4 outside the high-voltage gate 2 region. Due to the blocking effect of the blocking dielectric layer 6, the gate metal 5 in the high-voltage gate 2 region is higher than the blocking dielectric layer 6.

Embodiment 4

Based on the method for manufacturing the high-voltage metal gate device according to embodiment 1, in step S4, the thickness of the gate metal 5 deposited on the wafer is greater than the thickness of the isolation dielectric 4 between gates after step S2.

Further, in step S4, the thickness of the gate metal 5 deposited on the wafer is 30 nm-200 nm.

Embodiment 5

Based on the method for manufacturing the high-voltage metal gate device according to embodiment 1, in step S5, the gate metal CMP process is performed to reduce the thickness of the gate metal 5 deposited on the wafer, and the lowest position of an upper surface of the gate metal 5 is higher than the isolation dielectric 4 between gates.

Further, in S5, the gate metal CMP process is performed to reduce the thickness of the gate metal 5 deposited on the wafer by 1/3-2/3.

Further, the gate dielectric layer 8 is SiON, $HfO_2$ or $SiO_2$,

Further, the isolation dielectric 4 is SiN or $SiO_2$,

Further, the blocking dielectric layer 6 is SiN or $SiO_2$,

Further, the gate metal 5 is Al, Ti or W.

What are described above are only preferred embodiments of the present application and are not used to limit the present application. Any modification, equivalent replacement, improvement and the like made within the spirit and principle of the present application should be included in the scope of protection of the present application.

What is claimed is:

1. A method for manufacturing a high-voltage metal gate device, wherein the method for manufacturing the high-voltage metal gate device comprises the following steps:

S1: after a pre-process, performing gate photolithography, etching, and sidewall processes to define at least one dummy poly gate, the at least one dummy poly gate is a dummy poly high-voltage gate, dummy polycrystalline of the dummy poly gate being formed on a gate dielectric layer;

S2: filling isolation dielectric between the dummy poly gates and performing a chemical-mechanical polishing (CMP) process;

S3: removing the dummy polycrystalline on the gate dielectric layer of the dummy poly gate through selective etching;

S4: depositing a gate metal on a wafer;

S5: performing a gate metal CMP process to reduce a thickness of the gate metal deposited on the wafer;

S6: depositing a blocking dielectric layer on the gate metal;

S7: opening a high-voltage gate region through photolithography, and removing blocking dielectric layer outside the high-voltage gate region through etching;

S8: performing a gate metal CMP process to reduce the thickness of the gate metal deposited on the wafer, wherein due to a blocking effect of the blocking dielectric layer, the gate metal in the high-voltage gate region is higher than the gate metal outside the high-voltage gate region; and S9: removing the blocking dielectric layer on the gate metal in the high-voltage gate region through dry etching or acid pickling.

2. The method for manufacturing the high-voltage metal gate device according to claim 1, wherein, after step S9, the method for manufacturing the high-voltage metal gate device further comprises a step S10: performing a gate metal CMP process to adjust a height of the gate metal.

3. The method for manufacturing the high-voltage metal gate device according to claim 1, wherein, in step S8, the gate metal CMP process is performed to remove the gate metal above the isolation dielectric outside the high-voltage gate region, wherein due to the blocking effect of the blocking dielectric layer, the gate metal in the high-voltage gate region is higher than the blocking dielectric layer.

4. The method for manufacturing the high-voltage metal gate device according to claim 1, wherein, in step S1, the at least one dummy poly gate comprises at least one dummy polycrystalline high-voltage gate and one dummy polycrystalline low-voltage gate.

5. The method for manufacturing the high-voltage metal gate device according to claim 1, wherein a length of the dummy poly high-voltage gate is greater than 2.5 μm.

6. The method for manufacturing the high-voltage metal gate device according to claim 1, wherein, in step S4, the thickness of the gate metal deposited on the wafer is greater than a thickness of the isolation dielectric between gates after step S2.

7. The method for manufacturing the high-voltage metal gate device according to claim 6, wherein, in step S4, the thickness of the gate metal deposited on the wafer is 30 nm-200 nm.

8. The method for manufacturing the high-voltage metal gate device according to claim 1, wherein, in step S5, the gate metal CMP process is performed to reduce the thickness of the gate metal deposited on the wafer, and a lowest position of an upper surface of the gate metal is higher than the isolation dielectric between gates.

9. The method for manufacturing the high-voltage metal gate device according to claim 8, wherein, in step S5, the gate metal CMP process is performed to reduce the thickness of the gate metal deposited on the wafer by 1/3-2/3.

10. The method for manufacturing the high-voltage metal gate device according to claim 1, wherein the gate dielectric layer is SiON, $HfO_2$, or $SiO_2$, the isolation dielectric is SiN or $SiO_2$, the blocking dielectric layer is SiN or $SiO_2$, and the gate metal is Al, Ti, or W.

\* \* \* \* \*